(12) United States Patent
Natanzon

(10) Patent No.: US 12,026,386 B2
(45) Date of Patent: Jul. 2, 2024

(54) METHOD AND SYSTEM OF DIFFERENTIAL COMPRESSION

(71) Applicant: Huawei Technologies Co., Ltd., Shenzhen (CN)

(72) Inventor: Assaf Natanzon, Hod Hasharon (IL)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 91 days.

(21) Appl. No.: 17/951,477

(22) Filed: Sep. 23, 2022

(65) Prior Publication Data
US 2023/0019207 A1    Jan. 19, 2023

Related U.S. Application Data

(63) Continuation of application No. PCT/EP2020/058254, filed on Mar. 25, 2020.

(51) Int. Cl.
*G06F 3/06* (2006.01)

(52) U.S. Cl.
CPC .......... *G06F 3/0641* (2013.01); *G06F 3/0608* (2013.01); *G06F 3/0673* (2013.01)

(58) Field of Classification Search
CPC ..... G06F 3/0641; G06F 3/0608; G06F 3/0673
See application file for complete search history.

(56) References Cited

U.S. PATENT DOCUMENTS

| | | | |
|---|---|---|---|
| 2011/0099351 A1 | 4/2011 | Condict | |
| 2015/0026135 A1 | 1/2015 | Aronovich | |
| 2017/0123676 A1* | 5/2017 | Singhai | G06F 3/0608 |
| 2017/0147599 A1 | 5/2017 | Aronovich | |
| 2018/0025046 A1* | 1/2018 | Singhai | G06F 3/0641 707/692 |
| 2018/0032261 A1* | 2/2018 | Singhai | G06F 12/023 |
| 2019/0294589 A1* | 9/2019 | Moiseev | G06F 3/0608 |

FOREIGN PATENT DOCUMENTS

| | | |
|---|---|---|
| EP | 3376393 A1 | 9/2018 |
| WO | 2018111133 A1 | 6/2018 |
| WO | 2018139947 A1 | 8/2018 |

OTHER PUBLICATIONS

Broder, A., "On the resemblance and containment of documents," Proceedings. Compression and Complexity of Sequences 1997 (Cat. No.97TB100171), Jun. 1997, pp. 21-29.

* cited by examiner

*Primary Examiner* — Prasith Thammavong
(74) *Attorney, Agent, or Firm* — Conley Rose, P.C.

(57) ABSTRACT

A method for differential compression includes receiving input data blocks that are selected for compression. For each input data block, the input data block is divided into at least two segments. For each of the at least two segments, a similarity degree between the respective segment and each of the data blocks excluding the respective data block is computed. For each of the at least two segments, the data block which has a biggest similarity degree with the respective segment among the data blocks excluding the respective data block is selected as an optimal reference data block for the respective segment. The differential compression is applied to the input data block and optimal reference blocks in response to determining a differential compression that is to be applied based on the similarity degree between the segments of the input data block and the corresponding optimal reference blocks.

20 Claims, 5 Drawing Sheets

METHOD AND SYSTEM OF DIFFERENTIAL COMPRESSION

CROSS-REFERENCE TO RELATED APPLICATIONS

This application is a continuation application of International Patent Application No. PCT/EP2020/058254, filed on Mar. 25, 2020, which is hereby incorporated by reference in its entirety.

TECHNICAL FIELD

The present disclosure, in some embodiments thereof, relates to data compression and, more specifically, but not exclusively, to a method and system of differential compression.

BACKGROUND

Some data storage systems perform deduplication compression. In a standard deduplication process, data designated for storage is divided into aligned fixed-size blocks. For each fixed size block, a hash signature is computed by hashing the data within the respective block. Since the probability of two different blocks with identical hash signatures is very close to zero, blocks having identical hash signatures are identified as having identical data. Rather than storing the same data twice (by storing both blocks), one of the blocks is stored, and a pointer to the stored data represents the other identical block(s), which effectively compresses the multiple similar blocks into the size of about a single block.

Other data storage systems perform differential compression using a standard approach. Differential compression is performed by compressing the differences between a base block and other blocks that are similar. Data designated for storage is divided into aligned fixed sized blocks. For each fixed size block, a similarity hash function is computed. The similarity hash function is used to identify blocks that are not completely identical, but are similar in the sense that a majority of the blocks are the same (e.g., 90% of the content of two blocks is the same). For each block, multiple similar blocks are found.

SUMMARY

It is an object of the present disclosure to provide a system, a method, and a computer-readable storage medium storing program code, for differential compression.

The foregoing and other objects are achieved by the features of the independent claims. Further implementation forms are apparent from the dependent claims, the description and the figures.

According to a first aspect, a system for differential compression is disclosed. The system is configured to: receive a plurality of input data blocks selected for compression, for each input data block: divide the input data block into at least two segments, compute, for each of the at least two segments, a similarity degree between the respective segment and each of the plurality of data blocks excluding the respective data block, select, for each of the at least two segments, the data block which has a biggest similarity degree with the respective segment among the plurality of data blocks excluding the respective data block as an optimal reference data block for the respective segment, and apply the differential compression to the input data block and optimal reference blocks in response to determine a differential compression is to be applied based on the similarity degree between the segments of the input data block and the corresponding optimal reference blocks.

According to a second aspect, a method of differential compression of data is disclosed. The method comprises: receiving a plurality of input data blocks selected for compression, for each input data block: dividing the input data block into at least two segments, computing, for each of the at least two segments, a similarity degree between the respective segment and each of the plurality of data blocks excluding the respective data block, selecting, for each of the at least two segments, the data block which has a biggest similarity degree with the respective segment among the plurality of data blocks excluding the respective data block as an optimal reference data block for the respective segment, and applying the differential compression to the input data block and optimal reference blocks in response to determine a differential compression is to be applied based on the similarity degree between the segments of the input data block and the corresponding optimal reference blocks.

The system and method improve compression rates of input data blocks over a standard differential and/or deduplication approach, or provide compression rates at least as soon as the standard differential and/or deduplication approach.

In a further implementation form of the first aspect, the system is further configured to: apply a standard compression to the input block in response to determine a differential compression is not to be applied based on the similarity degree between the segments of the input data block and the corresponding optimal reference blocks. The standard compression corresponds to any data compression process that is available, for example, Lempel-Ziv based, Zip, Lzip, RAR, or any other compression process.

Implementations described herein are compatible with standard compression approaches, which may enable integration with the standard approaches.

In a further implementation form of the first aspect, the system is configured to: compare the similarity degree between the segments of the input data block and the corresponding optimal reference blocks with a threshold to determine whether or not a differential compression is to be applied based on the similarity degree.

The threshold may be set (e.g., manually and/or automatically), for example, to obtain an optimal tradeoff between compression (e.g., compression ratio or compression rate) and computational resource consumption.

In a further implementation form of the first aspect, two optimal reference blocks are selected for the input data block.

The overall size of all selected optimal reference blocks is significantly larger than the sizes of the input data block (e.g., double in the case of two non-overlapping segments per input block), which provides more data that is likely to be similar to the input data block, increasing compression efficiency.

In a further implementation form of the first aspect, the system is configured to: select a combination of optimal reference block for the at least two segments of the input data block by: iteratively computing a compression ratio indicative of compression efficiency of different combinations of reference data blocks in compressing the input data block, and selecting the combination of optimal reference data blocks according to the compression ratio.

Selecting optimal reference blocks in combination may provide a higher compression ratio that individually selecting each optimal reference block.

In a further implementation form of the first aspect, the system is configured to: select the optimal reference block for each respective segment of the input data block according to a combination of a highest similarity degree between the optimal reference block and the other segments of the input data block and highest similarity degree between the optimal reference block and the respective segment.

Selecting the optimal reference block as the block that provides greatest similarity coverage of all (or more than the respective segment) segments of the block may increase the compression efficiency. The exhaustive approach may find the combination of optimal reference blocks that provides the highest compression ratio.

In a further implementation form of the first aspect, the system is configured to: select the optimal reference blocks for the input data block by: computing the differential compression between the input data block and each of a plurality of different combinations of reference data blocks, and selecting the combination of optimal reference data blocks having a lowest differential compression.

The combination of optimal reference blocks that provides the best different compression may provide the best compression efficiency of the input block.

In a further implementation form of the first aspect, the system is configured to: select the optimal reference blocks for the input data block by: computing a differential compression between one segment of the input data block and an optimal reference data block which has a biggest similarity degree with the respective segment among the plurality of data block, and finding another optimal reference block which has a biggest similarity degree with respect to a differential compression between the input data block and the optimal reference block.

Searching for optimal reference blocks with the biggest similarity with respect to the differential compression represents an opportunistic search, which may be computationally efficient, for example, in comparison with the exhaustive search.

In a further implementation form of the first aspect, the system is configured to decompress the input data block by decompressing the optimal reference blocks and decompressing the differential compression.

In a further implementation form of the first aspect, the system is configured to determine whether a differential compression is to be applied, by: receiving the computed similarity degree between each segment of the input data block and each corresponding optimal reference block, comparing the computed similarity degree with a threshold, and determining the differential compression is to be applied when the similarity degree is above a threshold.

In a further implementation form of the first aspect, the similarity degree is computed by a similarity hash function.

The similarity hash function may be quickly performed by processing resources, enabling computationally efficiency implementation.

In a further implementation form of the first aspect, at least one of the corresponding optimal reference blocks is divided into at least two segments, with each of the segments mapped via a similarity dependency to a higher level optimal reference data block selected from the plurality of data blocks.

The multiple layers of optimal reference blocks may improve compression efficiency.

In a further implementation form of the first aspect, the input data block, the optimal reference blocks, and the higher level optimal reference data block are mapped by similarity dependency of a tree data structure, wherein the input data block is represented as a root of the tree data structure.

The number of levels of the tree may be defined, for example, as a tradeoff between compression and processing resource utilization. For example, higher levels of the tree may increase compression but require increased computational resources during decompression since more reference blocks are decompressed.

In a further implementation form of the first aspect, the system is configured to decompress the input data block by traversing the tree data structure and decompressing mapped optimal reference data blocks according to mapped relatively higher level optimal reference data blocks.

Reference data blocks not directly linked to the block being decompresses are not decompressed, which may reduce the number of blocks for decompression.

In a further implementation form of the first aspect, the system is configured to: divide the input data block into at least two non-even divided segments, compute the similarity degree for each non-evenly divided segment, and iteratively select a new non-even division of the data block and compute the similarity degree for the new non-even division, until value of the non-even division of the input data block that provides the highest similarity degree for corresponding divided segments is found.

The division into unequal (e.g., non-even in the case of two segments) sized segments and iterative selection of new non-even divisions may improve compression efficiency.

In a further implementation form of the first aspect, the at least two segments overlap.

The overlap of segments may improve the compression efficiency, by increasing the probability that corresponding optimal reference blocks will be found for each overlapping segment.

In a further implementation form of the first aspect, each of the plurality of input data blocks have a fixed data size.

Fixed or variable data size blocks may be selected to obtain optimal compression.

In a further implementation form of the second aspect, further comprising: applying a standard compression to the input block in response to determine a differential compression is not to be applied based on the similarity degree between the segments of the input data block and the corresponding optimal reference blocks.

In a further implementation form of the second aspect, further comprising: comparing the similarity degree between the segments of the input data block and the corresponding optimal reference blocks with a threshold to determine whether or not a differential compression is to be applied based on the similarity degree.

In a further implementation form of the second aspect, each of the plurality of input data blocks have a fixed data size.

According to a third aspect, a computer program product is disclosed. The computer program product comprises computer readable code instructions which, when run in a computer will cause the computer to perform the method of the second aspect or implementation forms of the second aspect.

According to a fourth aspect, a computer-readable storage medium is disclosed. The computer-readable storage medium stores program code, the program code comprising instructions, which when performed on a computer cause the computer to perform the method of the second aspect or implementation forms of the second aspect. The computer readable storage medium, comprises of one or more from the group: ROM (Read-Only Memory), PROM (Programmable ROM), EPROM (Erasable PROM), Flash memory, EEPROM (Electrically EPROM) and hard disk drive.

According to a fifth aspect, an apparatus for differential compression is disclosed. The apparatus includes a processor and a memory. The memory is storing instructions that cause the processor to perform the method according to the second aspect.

The apparatus according to the fifth aspect can be extended into implementation forms corresponding to the implementation forms of the method according to the second aspect. Hence, an implementation form of the apparatus comprises the feature(s) of the corresponding implementation form of the method according to the second aspect.

The advantages of the methods according to the fifth aspect are the same as those for the corresponding implementation forms of the method according to the second aspect.

Unless otherwise defined, all technical and/or scientific terms used herein have the same meaning as commonly understood by one of ordinary skill in the art to which the disclosure pertains. Although methods and materials similar or equivalent to those described herein can be used in the practice or testing of embodiments of the disclosure, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the disclosure are herein described, by way of example only, with reference to the accompanying drawings. With reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

In the drawings.

DETAILED DESCRIPTION

The present disclosure, in some embodiments thereof, relates to data compression and, more specifically, but not exclusively, to a method and system of differential compression.

An aspect of some embodiments relates to a system, a method, and/or computer-readable storage medium storing program code for differential compression of an input data block based on two or more optimal reference blocks. The input data block is divided into two or more segments. For each segment, an optimal reference block which includes data similar to the data of the segment is found. Two or more optimal reference blocks are found for the input data block. Differential compression is applied to the input data block and optimal reference blocks.

At least some implementations of the systems, methods, code instructions described herein reduce the size of compressed data, in comparison to standard approaches. Various technical problems in compression using standard approaches, which are solved by at least some implementations of the systems, methods, and/or computer-readable storage medium storing program code described herein, are now discussed.

Deduplication using fixed sized aligned data blocks usually suffers from low compression efficiency. Since the process of deduplication does not identify blocks that are similar, but only identifies blocks that are the same (i.e., the data of the blocks is identical and the offset is identical).

Situations where the same data is stored twice in different blocks with a different offset (compared to the block size) are not identified by the deduplication process. For example, the blocks have identical data, but data in one block is shifted 512 bytes relative to the other block. In another example, two blocks have identical data, but one block has additional unique data in one or more locations within the identical data. Lack of identifying and utilizing the similar data in such situations results in loss of the ability to apply deduplication to reduce size of the compressed data.

Standard differential compression processes improve over deduplication by taking advantage of the similarity of data in non-identical blocks. One approach taken by standard differential compression is to identify a parent block to which an input block is similar to. A single parent block is found for the input block. The parent block is used as a reference for compression of the input block, by compressing the difference between the input block and the reference block. The reference block is compressed on its own. To decompress the input block, a full copy of the decompressed reference block is required in advance. In another approach, multiple similar blocks are compressed together as a group. In order to decompress one block of the group, the entire group needs to be decompressed. Thus, to read one block there is a need to read a large set of reference blocks. While in at least some implementations of the systems, methods, and and/or computer-readable storage medium storing program code described herein, two reference blocks are required to achieve compression ratios higher than variable size deduplication.

The standard differential compression processes based on identifying the reference block do not provide efficient compression when data shifts between blocks are large.

Figure 1A:
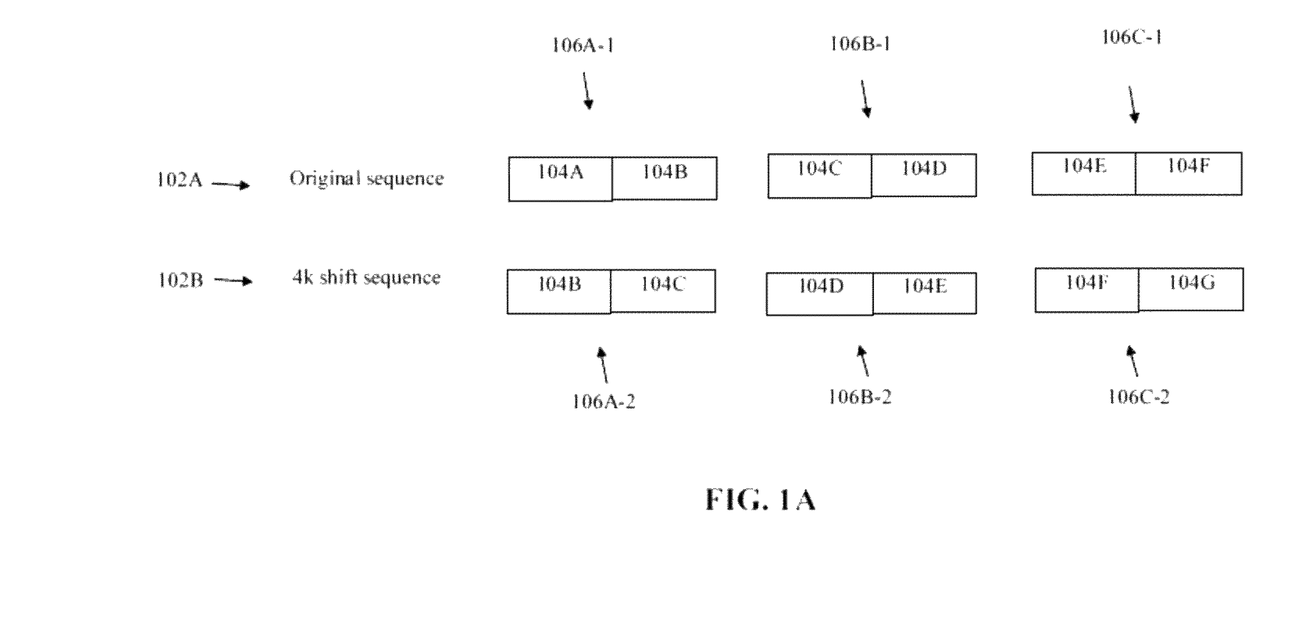
FIG. 1A is a schematic to help understand reduction in compression efficiency of the standard differential compression process, which is utilized by implementations of the differential compression process described herein, in accordance with some embodiments.

Reference is now made to FIG. 1A, which is a schematic to help understand reduction in compression efficiency of the standard differential compression process, which is utilized by implementations of the differential compression process described herein, in accordance with some embodiments. Original sequence of data 102A (e.g., size 24 kilobytes (kB)) includes three blocks 106A-1, 106B-1, and 106C-1. Each block is of a fixed size, for example, 8 kB. Each block stores two 4 kB blocks of data. Block 106A-1 stores 104A and 104B. Block 106B-1 stores 104C and 104D. Block 106C-1 stores 104E and 104F. Another sequence of data 102B (e.g., same size as original sequence 102A, such as 24$k$ kB) stores mostly the same data as original sequence 102A, with a shift of 4 kB. Shifted sequence of data 102B includes three blocks 106A-2, 106B-2, and 106C-2. Each block is of the same fixed size as the blocks of original sequence 102A, and stores two 4 kB blocks of data. Block 106A-2 stores 104B and 104C. Block 106B-2 stores 104D and 104E. Block 106C-2 stores 104F and 104G. Now, applying the standard differential process by finding reference blocks, would match block 106A-1 to 106A-2 since data 104B is common to both, match block 106B-1 to 106B-2 since data 104D is common to both, and match block 106C-1 to 106C-2 since data 104F is common to both. Only half the data of the matched blocks is identical, resulting in inefficient compression, even though data 104B, 104C, 104D, 104E, and 104F are identical in sequences 102A and 102B.

At least some implementations of the systems, methods, and/or computer-readable storage medium storing program code described herein provide additional compression efficiency over standard approaches such as the above discussed standard differential process that finds a single reference block for a certain input block. The improvement is based on utilizing the identical data of each input block that spread amongst multiple reference blocks. In other words, two or more reference blocks are identified for a single input block, in contrast to standard approaches where a single reference block is identified for a single input block. As described herein in additional detail, the input block is segmented into two or more segments. A reference block is found for each segment. Multiple reference blocks are found for each input block, which improves the compression efficiency over standard approaches. For example, data block 106B-1 is segmented into two segments, corresponding to data 104C and 104D. Block 106A-2, which includes data 104C is identified for the first segment (i.e., that includes data 104C). Block 106B-2, which includes data 104D is identified for the second segment (i.e., that includes data 104D). Differential compression is performed for input block 106B-1 using reference blocks 106A-2 and 106B-2, which together include data identical to entire block 106B-1. Similarly, Differential compression is performed for input block 106C-1 using reference blocks 106B-2 and 106C-2, which together include data identical to entire block 106C-1.

At least some implementations of the systems, methods, and/or computer-readable storage medium storing program code described herein reduce the amount of decompression of reference blocks used to decompress a reference block. At most, the two or more reference blocks identified for the input block are decompressed in order to decompress the input block.

At least some implementations of the systems, methods, and/or computer-readable storage medium storing program code described herein achieve compression ratios which are at least as good as compression obtained by variable size deduplication with average block size the same as the fixed block size to which implementations described herein are applied. For example, a process based on variable length deduplication divides the data into variable sized blocks. When two variable sized blocks are identical, deduplication is performed as discussed above. When the data of a certain input block is de-duplicated using variable length deduplication, it implies that the data of the certain input block already appears in previously stored reference data but at a different alignment. The alignment offset may at most result in the same data appearing in two other reference blocks. Now, if the two reference blocks are used for differential compression of the input block, the data stored in the input block is completely differentially compressed.

Figure 1B:
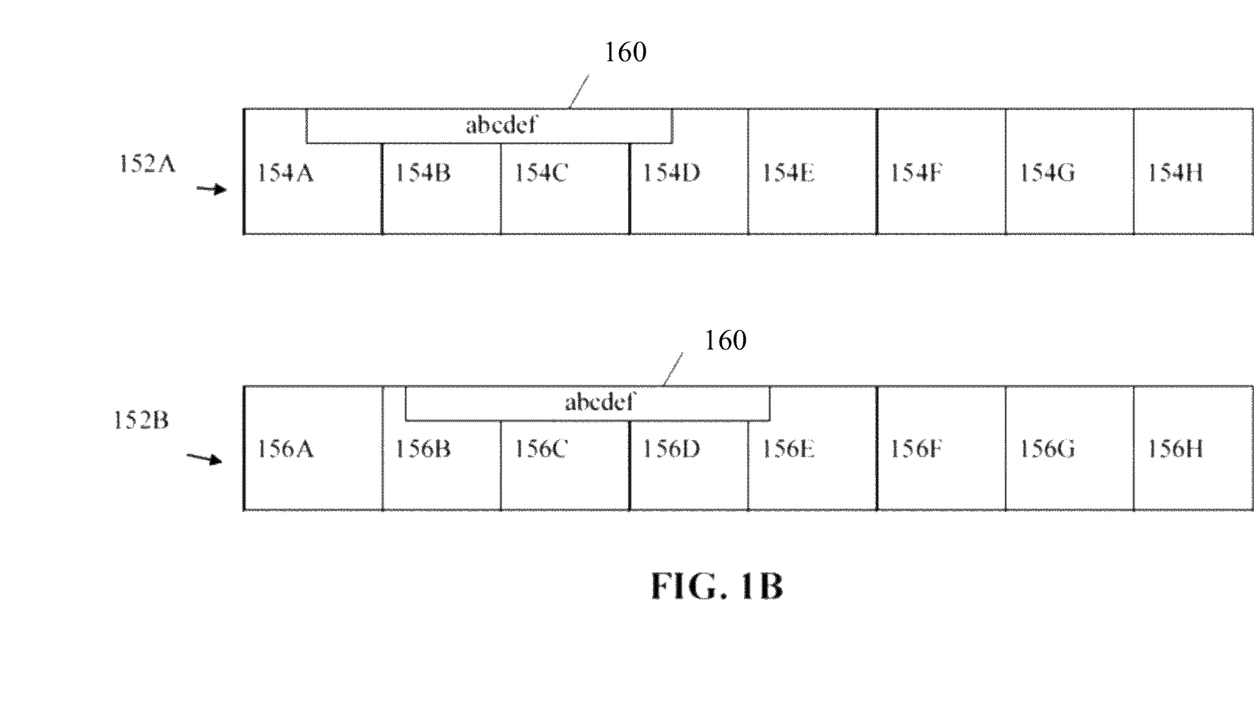
FIG. 1B is a schematic to help understand how differential compression using implementations described herein is as least as good as variable size deduplication with average block size the same as the fixed block size to which implementations described herein are applied.

Reference is now made to FIG. 1B, which is a schematic to help understand how differential compression using implementations described herein is as least as good as variable size deduplication with average block size the same as the fixed block size to which implementations described herein are applied. Dataset 152A is divided into blocks 154A-H, and dataset 152B is divided into blocks 160A-H. Each of block 154A-H and 160A-H may be, for example, of size 8 kB aligned to an offset of 8 kB. Applying a variable length deduplication process identifies identical data 160 (denoted "abcdef") in datasets 152A and 152B, which enables full compression of one data 160 (e.g., in input dataset 152B) by maintaining the copy of data 160 in the other dataset (e.g., reference dataset 152A). At least some implementations of the systems, methods, and/or computer-readable storage medium storing program code described herein achieve at least a similar compression efficiency, by differential compression of the portion of data 160 found in 156B of input dataset 152B using reference blocks 154A and 154B of reference dataset 152A, differential compression of the portion of data 160 found in 156C using reference blocks 154B and 154C, differential compression of the portion of data 160 found in 156D using reference blocks 154C and 154D, and differential compression of the portion of data 160 found in 156E using reference blocks 154D and 154E.

Before explaining at least one embodiment of the disclosure in detail, it is to be understood that the disclosure is not necessarily limited in its application to the details of construction and the arrangement of the components and/or methods set forth in the following description and/or illustrated in the drawings and/or the Examples. The disclosure is capable of other embodiments or of being practiced or carried out in various ways.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network, a wide area network and/or a wireless network.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
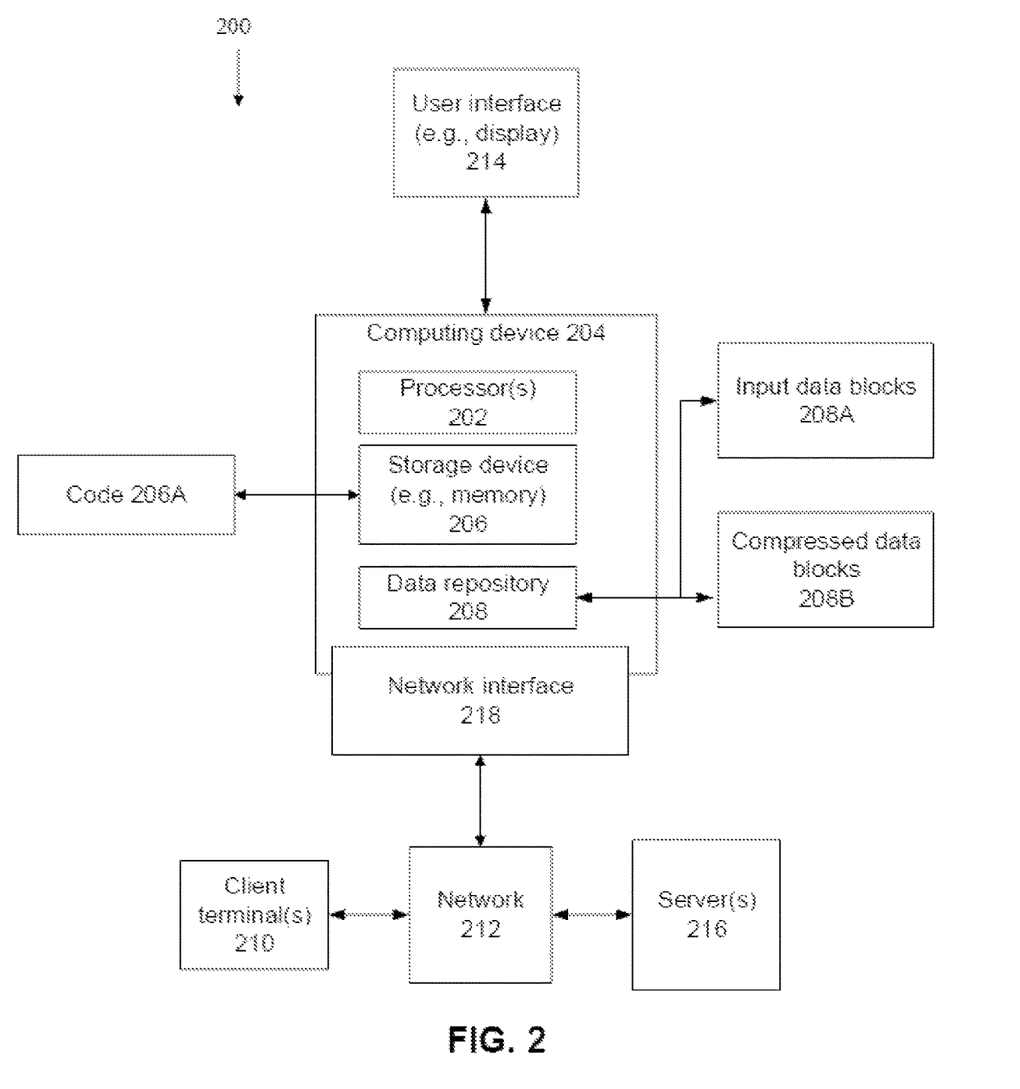
FIG. 2 is a block diagram of components of a system for differential compression based on selecting an optimal reference block for each segment of an input block, in accordance with some embodiments.
Figure 3:
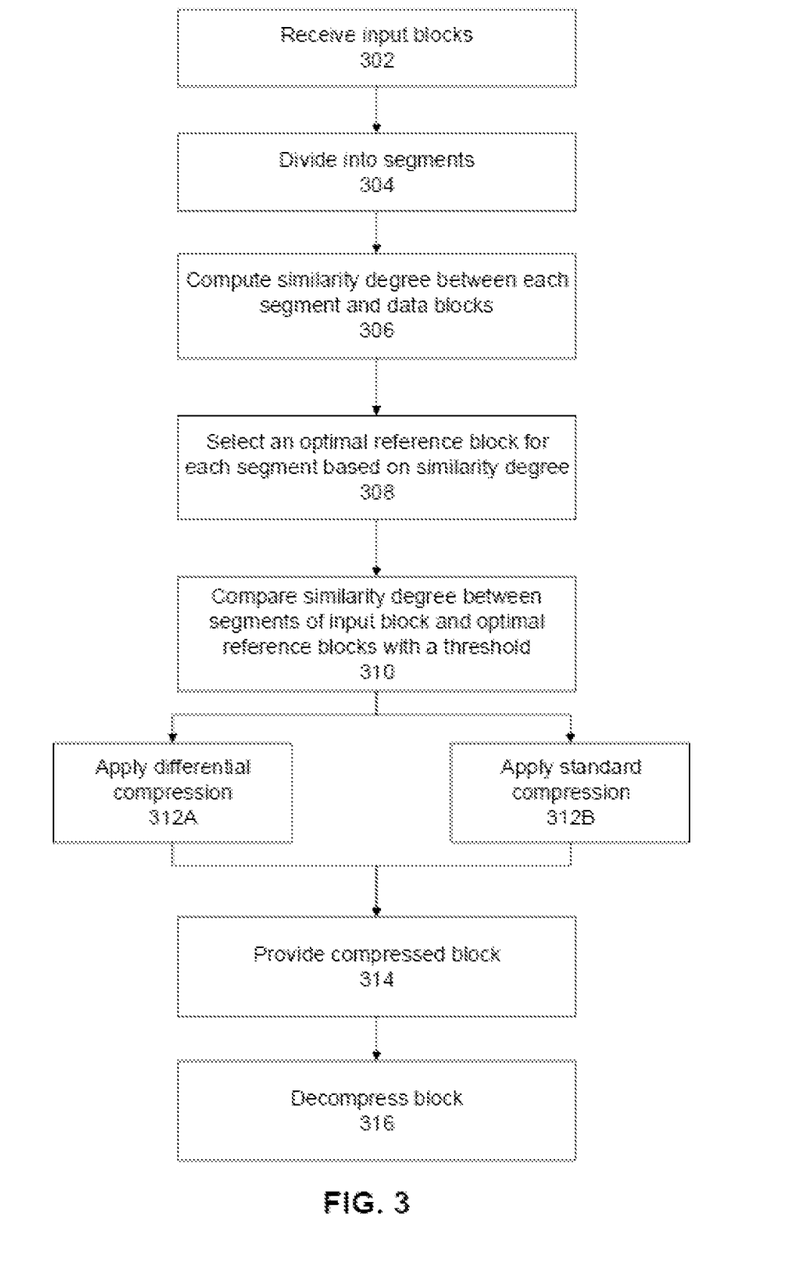
FIG. 3 is a flowchart of a method of differential compression based on selecting an optimal reference block for each segment of an input block, in accordance with some embodiments.

Reference is now made to FIG. 2, which is a block diagram of components of a system 200 for differential compression based on selecting an optimal reference block for each segment of an input block, in accordance with some embodiments. Reference is also made to FIG. 3, which is a flowchart of a method of differential compression based on selecting an optimal reference block for each segment of an input block, in accordance with some embodiments. System 200 may implement the acts of the method described with reference to FIG. 3, by processor(s) 202 of a computing device 204 executing code instructions (e.g., code 206A) stored in a memory 206.

Computing device 204 and/or client terminal(s) 210 and/or server(s) 216 may be implemented as, for example one or more and/or combination of a group of connected devices, a client terminal, a server, a virtual server, a computing cloud, a virtual machine, a sensor, a camera, a desktop computer, a thin client, a network node, a network server, and/or a mobile device (e.g., a Smartphone, a Tablet computer, a laptop computer, a wearable computer, glasses computer, and a watch computer).

Different architectures of system 200 may be implemented, for example, computing device 204 may be implemented as one or more servers (e.g., network server, web server, a computing cloud, a virtual server, a network node) that provides services to multiple client terminals 210 and/or servers 216 over a network 212, for example, software as a service (SaaS), compression services to selected files (e.g., for storage and/or transfer over a network), and/or backup services to files stored on a storage device of the respective client terminal and/or server.

In one example, users using client terminal(s) 210 provide a file to computing device 204, which compresses the file, and receive back a compressed version of the file. In another example, a user using a mobile device to access a web site hosted on server(s) 216 clicks on a file to download. Server(s) 216 provide the selected file to computing device 204, which compresses the file, and provides a compressed version of the file to server(s) 216, which transmits the compressed file to the mobile device accessing the web site. In yet another example, a backup program running on server(s) 216 performs regularly scheduled backup of data by transmitting the data to computing device 204 for compression.

Communication between client terminal(s) 210 and/or server(s) 216, and computing device 204 over network 212 may be implemented, for example, via an application programming interface (API), software development kit (SDK), functions and/or libraries and/or add-ons added to existing applications executing on client terminal(s) 210 and/or sever(s) 216, an application for download and execution on client terminal(s) 210 and/or server(s) 216 that communicates with computing device 204, function and/or interface calls to code executed by computing device 204, a remote access section executing on a web site hosted by computing device 204 accessed via a web browser executing on client terminal(s) 210.

Computing device 204 may be implemented as a stand-alone device (e.g., client terminal, smartphone, smart television, computing cloud, virtual machine, kiosk, and sensor, etc.) that includes locally stored code that implement one or more of the acts described with reference to FIG. 3. For example, computing device 204 may be implemented as a data storage server that compresses stored data for backup purposes. In another example, computing device 204 may be implemented as a sensor that senses data and compresses the sensed data. In yet another example, computing device 204 may be implemented as a camera that captures an image and compresses the image. It is noted that the implementations described herein may provide increased compression efficiency where data is mostly similar, such as in backup, sensor collected data, and images.

Hardware processor(s) 202 of computing device 204 may be implemented, for example, as a central processing unit(s) (CPU), a graphics processing unit(s) (GPU), an FPGA, digital signal processor(s) (DSP(s)), and application-specific integrated circuit(s) (ASIC(s)). Processor(s) 202 may include a single processor, or multiple processors (homogenous or heterogeneous) arranged for parallel processing, as clusters and/or as one or more multi core processing devices.

Memory 206 stores code instructions executable by hardware processor(s) 202, for example, a random-access memory (RAM), a read-only memory (ROM), and/or a storage device, for example, non-volatile memory, magnetic media, semiconductor memory devices, hard drive, removable storage, and optical media (e.g., digital video disc (DVD), compact disk-ROM (CD-ROM)). Memory 206 stores code 206A that implements one or more features and/or acts of the method described with reference to FIG. 3 when executed by hardware processor(s) 202.

Computing device 204 may include data storage device(s) 208 for storing data, for example, input data blocks 208A (which are to be compressed) and/or the compressed data blocks 208B (which are created by compression of input data blocks 208A, as described herein). Data storage device(s) 208 may be implemented as, for example, a memory, a local hard-drive, virtual storage, a removable storage unit, an optical disk, a storage device, and/or as a remote server and/or computing cloud (e.g., accessed using a network connection).

Network 212 may be implemented as, for example, the internet, a local area network, a virtual network, a wireless network, a cellular network, a local bus, a point to point link (e.g., wired), and/or combinations of the aforementioned.

Computing device 204 may include a network interface 218 for connecting to network 212, for example, one or more of, a network interface card, an antenna, a wireless interface to connect to a wireless network, a physical interface for connecting to a cable for network connectivity, a virtual interface implemented in software, network communication software providing higher layers of network connectivity, and/or other implementations.

Computing device 204 and/or client terminal(s) 210 and/or server(s) 216 include and/or are in communication with one or more physical user interfaces 214 that include a mechanism for user interaction, for example, to enter data (e.g., select the file for compression) and/or to view data (e.g., view a message indicating that the file has been compressed).

Exemplary physical user interfaces 214 include, for example, one or more of, a touchscreen, a display, gesture activation devices, a keyboard, a mouse, and voice activated software using speakers and microphone.

At 302, input data blocks selected for compression and deduplication are received. The input data blocks may be manually selected (e.g., a user clicks on a file and selects a save option) and/or automatically selected (e.g., by an automated backup process that back up files stored on a server at predefined time intervals, such as daily), and/or written by an application for example a database.

It is noted that a host (e.g., client terminal, application) may provide the data for compression to the computing device. The data provided by the host has a certain offset and/or size.

The received data is further processed by being divided into input data blocks, optionally by the computing device. Optionally, the data received for compression is divided into input data blocks having a fixed data size, for example, a large file selected for compression is divided into fixed sized data blocks. Alternatively, the data received for compression is divided into input data blocks of variable size. The division of the received data for compression into variable sizes may be performed, for example, based on standard variable length deduplication processes, where only the portion of the standard variable length deduplication processes that perform the variable division is used. Deduplication compression using the standard variable length deduplication processes is not used, since differential compression as described herein is used instead.

The data received for compression (which is divided into the input data blocks) may be, for example, manually selected by a user for compression (e.g., a user clicks on a file and selects a save option) and/or automatically selected by code (e.g., by code that compresses data for transmission over a network, and/or by an automated backup process that back up files stored on a server at predefined time intervals, such as daily).

The data received for compression may store, for example, text, images, binary code, symbols, numbers, and/or other data formats. The input data blocks may be portions of data files.

Features described with reference to 304-316 are performed for each respective input block. The other input blocks (i.e., other than the respective input block) may be stored in a memory and selected as optimal reference blocks for the respective input block, as described herein.

At 304, the input data block is divided into two or more segments. The optimal number of segments may be selected, for example, based on a tradeoff where increasing number of segments provide improved compression efficiency (which may peak at a certain number of segments) requires increasing computational resources to perform.

Exemplary numbers of segments include: two, three, and four. In some implementations, two segments are used.

Optionally, the input data block is divided into equal sized segments. Alternatively, the input data block is divided into unequal sized segments. The division into unequal sized segments may improve compression efficiency, as described below with reference to 310.

The segments may be contiguous without overlap of data. Alternatively, the segments overlap one another, optionally by a predefined percentage and/or amount of data, for example, about 10%, or 20%, or 30% or other values. The overlap of segments may improve the compression efficiency, by increasing the probability that corresponding optimal reference blocks will be found for each overlapping segment. The optimal overlap or no overlap of the segments may be selected, for example, based on a tradeoff where increasing overlap provides improved compression efficiency but too much overlap reduced compression efficiency.

The overall size of all selected optimal reference blocks is significantly larger than the sizes of the input data block (e.g., double in the case of two non-overlapping segments per input block), which provides more data that is likely to be similar to the input data block, increasing compression efficiency.

At 306, for each respective segment, a similarity degree between the respective segment and the data blocks (excluding the respective data block that includes the respective segment) is computed. Optionally, the similarity degree is computed between the respective segment and each of the data blocks. Alternatively, the similarity degree is computed between some of the other data blocks and not computed for other data blocks, for example, based on heuristic processes that first select a subset of candidate blocks based on a fast correlation computation that are likely to be similar, and the similarity degree is computed for each one of the subset of candidate blocks.

Optionally, the similarity degree is computed by a similarity hash function that computes an indication of how similar two datasets are, for example, the MinHash process (also referred to as min-wise independent permutations locally sensitive hashing scheme), for example, as described with reference to Broder, *Andrei Z.* (1997), "On the resemblance and containment of documents", Compression and Complexity of Sequences: Proceedings, Positano, Amalfitan Coast, Salerno, Italy, Jun. 11-13, 1997 (PDF), IEEE, pp. 21-29. The similarity hash function may be quickly performed by processing resources, enabling computationally efficiency implementation.

At 308, for each respective segment, an optimal reference data block is selected from the among the data blocks (i.e., excluding the respective data block that includes the respective segment). The optimal reference block may be selected as the data block which has a biggest similarity degree with the respective segment among the data blocks (i.e., excluding the respective data block that includes the respective segment).

One reference data block is selected per segment. Exemplary numbers of optimal reference data block include: two, three, and four. In some implementations, two optimal reference blocks are selected.

Optionally, each optimal reference block is independently selected for the respective segment of the respective input block. Selection of the optimal reference block may be made per segment, without consideration of selection of other optimal reference block(s) of the segment(s) of the respective input block. Alternatively or additionally, the optimal reference blocks are selected as a combination for the segments of the input data block.

Exemplary processes for selection of the optimal reference blocks include the following.

Selecting a combination of optimal reference block for the segments of the input data block by iteratively computing a compression ratio indicative of compression efficiency of different combinations of reference data blocks in compressing the input data block. The iterations may be based on an exhaustive search, where each combination is evaluated. The compression efficiency may be computed for the differential compression between the combination of optimal reference blocks and the input reference block. The combination of optimal reference data blocks may be selected according to the compression ratio, for example, the combination of optimal reference blocks that provide the highest compression ratio is selected. Selecting optimal reference blocks in combination may provide a higher compression ratio that individually selecting each optimal reference block. The exhaustive approach may find the combination of optimal reference blocks that provides the highest compression ratio.

Selecting the optimal reference block for each respective segment of the input data block according to a combination of a highest similarity degree between the optimal reference block and the other segments of the input data block and highest similarity degree between the optimal reference block and the respective segment. Selecting the optimal reference block as the block that provides greatest similarity coverage of all (or more than the respective segment) segments of the block may increase the compression efficiency.

Selecting the optimal reference blocks for the input data block by computing the differential compression between the input data block (i.e., between the segments of the input data block) and each of multiple different combinations of reference data blocks. The combination of optimal reference data blocks having a lowest differential compression is selected. The combination may be unique, in that the unique combination is the only case in which the optimal reference blocks are selected as a set. The combination of optimal reference blocks that provides the best different compression may provide the best compression efficiency of the input block.

Selecting the optimal reference blocks for the input data block by computing a differential compression between the respective segment of the input data block and an optimal reference data block which has a biggest similarity degree with the respective segment among the data block. A differential compression is computed between the input data block (i.e., between the respective segment, and/or between the whole block) and the optimal reference block. For the other segment(s) of the data block, another optimal reference block which has a biggest similarity degree with respect to the differential compression is found. Searching for optimal reference blocks with the biggest similarity with respect to the differential compression represents an opportunistic search, which may be computationally efficient, for example, in comparison with the exhaustive search.

Optionally, one or more of the selected optimal reference blocks is divided into two or more segments, with one or more of the segments being mapped via a similarity dependency to a higher-level optimal reference data block selected from the data blocks. There may be two or more levels of optimal reference blocks. Optionally, the input data block, the (first level) optimal reference blocks, and the one or more higher levels of optimal reference data block are mapped by similarity dependency of a tree data structure. The input data block is represented as a root of the tree data structure. The multiple layers of optimal reference blocks may improve compression efficiency. The tradeoff of the increased compression efficiency is that in order to decompress the input data block, the entire tree data structure is decompressed.

Figure 4:
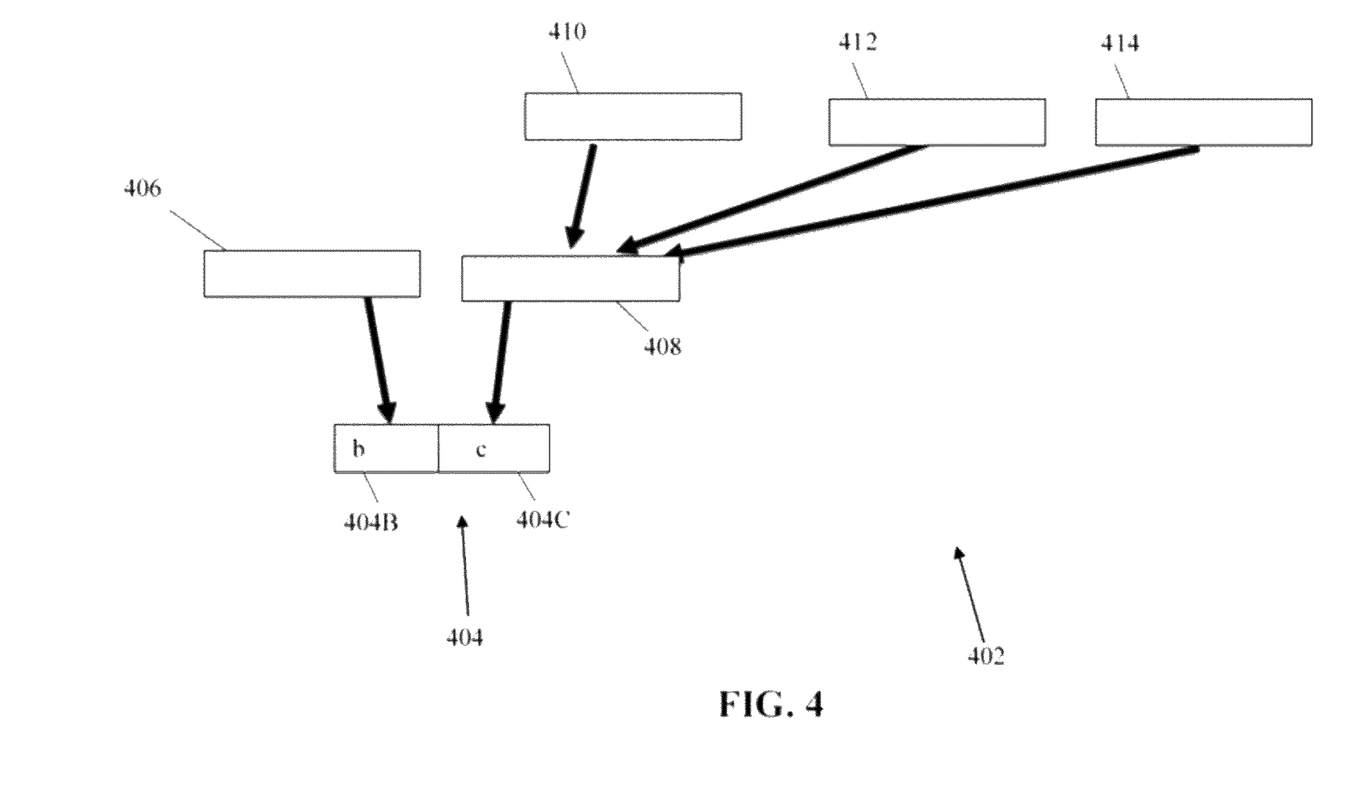
FIG. 4 is a schematic depicting an example of a tree data structure of segments mapped via similarity dependencies to higher level optimal reference data blocks, in accordance with some embodiments.

Reference is now made to FIG. 4, which is a schematic depicting an example of a tree data structure 402 of segments mapped via similarity dependencies to higher level optimal reference data blocks, in accordance with some embodiments. Input data block 404 (shown as root of tree 402) is divided into segments 404B and 404C. Segment 404B is mapped to optimal reference block 406, where optimal reference block 406 is not mapped to higher levels. Segment 404C is mapped to optimal reference block 408, where optimal reference block 408 is mapped via similarity dependencies to higher-level optimal reference blocks 410, 412, and 414. It is noted that optimal reference block 408 is divided into three segments (not shown), where each segment of optimal reference block 408 is mapped to one respective higher-level optimal reference block 410 412 and 414. To decompress block 408, blocks 410, 412 and 414 are decompressed. No data from blocks 404 and 406 is used to decompress block 408.

Referring now back to FIG. 3, at 310, the similarity degree between the segments (e.g., each segment) of the input data block and the corresponding optimal reference blocks (e.g., each corresponding optimal reference block) may be evaluated according to a requirement, for example, compared with a threshold and/or range. A determination of whether or not a differential compression is to be applied may be made based on the similarity degree between the segments of the input data block and the corresponding optimal reference blocks.

When the segments are unequally divided, the similarity degree is computed for each unequally divided segment. Optionally, a new unequal (e.g., non-even) division of the data block is iteratively performed, and the similarity degree is iteratively computed for the new unequally divided segments, until value of the non-equal division of the input data block that provides the highest similarity degree for corresponding unequally divided segments is found. The division into unequal (e.g., non-even in the case of two segments) sized segments and iterative selection of new non-even divisions may improve compression efficiency.

At 312A, the differential compression is applied to the input data block and optimal reference blocks, in response to the determination that the differential compression is to be applied as described with reference to 310. The differential compression process may compress the part of the input data block that does not appear within the optimal reference blocks, while the identical part of the input data block appearing within the optimal reference block is entirely compressed (e.g., using a pointer to point to the location of the identical data).

The differential compression may be applied when the similarity degree is above the threshold and/or within the range. The range may exclude segments that are identical (e.g., similarity degree equal to 100% or 1). Identical segments may be compressed by other processes, such as deduplication. The threshold may be selected, for example, according to a tradeoff where an increasing similarity degree results in higher compression efficiency, but reduced likelihood of finding blocks.

Alternatively to 312A, at 312B, a standard compression is applied to the input block.

The standard compression is applied in response to the determination that the differential compression is not to be applied as described with reference to 310. The standard compression may be applied when the similarity degree between the segments of the input data block and the corresponding optimal reference blocks is below the threshold and/or outside the range. The standard compression may be any data compression process that is available, for example, Lempel-Ziv based, Zip, Lzip, RAR, or any other compression process.

Alternatively, the standard compression may be a standard deduplication, which is applied when the similarity degree between the segments of the input data block and the corresponding optimal reference blocks indicates an exact match. In such a case, since a complete copy of the input data block is available in the corresponding optimal reference blocks, the input data block may be entirely compressed, for example, using a pointer to indicate the corresponding location of the identical data using standard deduplication methods.

At 314, the compressed block is provided. For example, the compressed block may be locally stored in a memory and/or other data storage device, and/or transmitted over a network (e.g., where the data is compressed to improve transmission over the network), and/or provided to another device (e.g., provided to a cloud storage facility for storage, and/or provided to a client terminal in response to a file provided by the client terminal to a server for compression services).

The multiple compressed blocks corresponding to the multiple input data blocks selected for compression may be provided, for example, as a single compressed file.

At 316, the input compressed data block(s) may be decompressed, for example, to retrieved back-up data, and/or by a device that receives the compressed data over the network.

When the compressed data block is compressed by differential compression as described with reference to 312A, the compressed data block is decompressed by decompressing the optimal reference blocks (i.e., selected for the segments of the compressed data block) and decompressing the differential compression computed for the input data block and the selected optimal reference blocks.

When the optimal reference blocks are mapped to relatively higher-level optimal reference blocks, for example, in a tree data structure as described herein, the input data block is decompressed by traversing the tree data structure and decompressing mapped optimal reference data blocks according to mapped relatively higher level optimal reference data blocks. The mapped optimal reference data blocks are decompressed by decompressing the highest-level optimal reference blocks and decompressing the differential compression computed between the lower levels of optimal reference blocks and the higher levels of optimal reference blocks. For example, referring back to FIG. 4, in order to decompress input block 404, segments 404B and 404C of block 404 are decompressed. To decompress segment 404B, optimal reference block 406 is decompressed and the differential compression between block 406 and segment 404B is decompressed. To decompress segment 404C, optimal reference block 408 is decompressed and the differential compression between block 408 and segment 404C is decompressed. However, to decompress optimal reference block 408, the mapped higher-level optimal reference blocks 410 412 and 414 are decompressed, and the differential compression between blocks 410 412 414 and block 408 is decompressed.

Referring now back to 316 of FIG. 3, when the compressed data block is compressed by standard compression as described with reference to 312B, the compressed data block is decompressed by standard decompression corresponding to the standard compression.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant data blocks will be developed and the scope of the term data block is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Throughout this application, various embodiments of this disclosure may be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. Certain features described in the context of various embodiments are not to be considered essential features of those embodiments, unless the embodiment is inoperative without those elements.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present disclosure. To the extent that section headings are used, they should not be construed as necessarily limiting.

What is claimed is:

1. A system for differential compression, wherein the system comprises:
    a network interface configured to receive a plurality of input data blocks for compression, wherein the plurality of input data blocks comprises a first input data block and second input data blocks; and
    a processor coupled to the network interface and configured to cause the system to:
        divide the first input data block into a first segment and a second segment;
        compute first similarity degrees between the first segment and each of the second input data blocks;
        compute second similarity degrees between the second segment and each of the second input data blocks;
        select a highest first similarity degree from among the first similarity degrees;
        select a highest second similarity degree from among the second similarity degrees;
        select, as a first optimal reference data block, the second input data block associated with the highest, first similarity degree;
        select, as a second optimal reference data block, the second input data block associated with the highest second similarity degree; and
        apply, based on a third similarity degree between the first segment and the first optimal reference data block and based on a fourth similarity degree between the second segment and the second optimal reference data block, differential compression to the first input data block, the first optimal reference data block, and the second optimal reference data block in response to determining that the differential compression is to be applied.

2. The system of claim 1, wherein the processor further causes the system to be configured to apply a standard compression to the plurality of input data blocks in response to determining that the differential compression is not to be applied.

3. The system of claim 1, wherein the processor further causes the system to be configured to compare the first similarity degree and the second similarity degree with a threshold to determine whether any differential compression is to be applied.

4. The system of claim 1, wherein the processor further causes the system to be configured to select two optimal reference data blocks for the plurality of input data blocks.

5. The system of claim 1, wherein the processor further causes the system to be configured to select a combination of third optimal reference data blocks for the first segment and the second segment by:
    iteratively computing a compression ratio that indicates a compression efficiency of different combinations of the third optimal reference data blocks in compressing the plurality of input data blocks; and
    selecting a second combination of the third optimal reference data blocks according to the compression ratio.

6. The system of claim 1, wherein the processor further causes the system to be configured to select the first and the second optimal reference data blocks according to a combination of the highest first similarity degree and the highest second similarity degree.

7. The system of claim 1, wherein the program instructions further cause the system to be reconfigured to select the first and the second optimal reference data blocks by:
    computing the differential compression between the plurality of input data blocks and each combination of a plurality of different combinations of the first and the second optimal reference data blocks; and
    selecting a combination from of the first optimal reference data block and the second optimal reference data blocks having a lowest differential compression.

8. The system of claim 1, wherein the processor further causes the system to be configured to, select the first and the second optimal reference data blocks by:
    computing a second differential compression between one of the first or the second segments and second optimal reference data blocks associated with a highest third similarity degree among the highest first similarity degree and the highest second similarity degree; and
    finding another optimal reference data block that has a highest similarity degree in relation to the second differential compression.

9. The system of claim 1, wherein the processor further causes the system to be configured to decompress the plurality of input data blocks by decompressing the first and the second optimal reference data blocks and decompressing the differential compression.

10. The system of claim 1, wherein the processor further causes the system to be configured to determine whether the differential compression is to be applied, by:
receiving the third similarity degree and the fourth similarity degree;
comparing the third and the fourth similarity degrees with a threshold; and
determining that the differential compression is to be applied when the third similarity degree and the fourth similarity degree are above a threshold.

11. The system of claim 1, wherein the processor further causes the system to be configured to compute each of the first similarity degree, the second similarity degree, the third similarity, degree and the fourth similarity degree using a similarity hash function.

12. The system of claim 1, wherein the processor further causes the system to be configured to divide at least one of the first optimal reference data block and the second optimal reference data block into at least two segments, wherein each of the at least two segments is mapped via a similarity dependency to higher level optimal reference data blocks of the plurality of input data blocks.

13. The system of claim 12, wherein the processor further causes the system to be configured to map the plurality of input data blocks, the first optimal reference data block and the second optimal reference data blocks, and the higher level optimal reference data blocks by similarity dependency of a tree data structure, wherein the plurality of input data blocks is represented as a root of the tree data structure.

14. The system of claim 13, wherein the processor further causes the system to be configured to decompress the plurality of input data blocks by:
traversing the tree data structure, and
decompressing mapped optimal reference data blocks according to mapped relatively higher level optimal reference data blocks.

15. The system of claim 1, wherein the processor further causes the system to be configured to:
divide the first input data block into at non-evenly divided segments;
compute third similarity degrees for each of the non-evenly divided segments; and
iteratively select a new non-even division segment of the first input data block and compute fourth similarity degree for the new non-even division segment until a value of the new non-even division segment provides a highest third similarity degree for a divided segment among the non-evenly divided segments.

16. The system of claim 1, wherein the first segment overlaps with the second segment, and wherein each of the plurality of input data blocks have a fixed data size.

17. A method of differential compression of data, the method comprising:
receiving a plurality of input data blocks for compression, wherein the plurality of input data blocks comprises a first input data block and second input data blocks;
dividing the first input data block into a first segment and a second segment;
computing first similarity degrees between the first segment and each of the second input data blocks;
computer second similarity degrees between the second segment and each of the second input data blocks;
selecting a highest first similarity degree from among the first similarity degrees;
selecting a highest second similarity degree from among the second similarity degrees;
selecting, as a first optimal reference data block the second input data block associated with the highest first similarity degree;
selecting, as a second optimal reference data block, the second input data block associated with the highest second similarity degree; and
applying, based on a third similarity degree between the first segment and the first optimal reference data block and based on a fourth similarity degree between the second segment and the second optimal reference data block the differential compression to the first input data block, the first optimal reference data block, and the second optimal reference data block in response to determining that the differential compression is to be applied.

18. The method of claim 17, further comprising: applying a standard compression to the plurality of input data blocks in response to determining that the differential compression is not to be applied.

19. The method of claim 17, further comprising: comparing the first similarity degree and the second similarity degree with a threshold to determine whether any differential compression is to be applied.

20. A computer program product comprising computer-executable instructions that are stored on a non-transitory computer-readable storage medium and that, when executed by a processor of a system for differential compression, causes the system to be configured to:
receive a plurality of input data blocks for compression, wherein the plurality of input data blocks comprises a first input data block and second input data blocks;
divide the first input data block into a first segment and a second segment;
compute first similarity degrees between the first segment and each of the second input data blocks;
compute second similarity degrees between the second segment and each of the second input data blocks;
select a highest first similarity degree from among the first similarity degrees;
select a highest second similarity degree from among the second similarity degrees;
select, as a first optimal reference data block, the second input data block associated with the highest first similarity degree;
select, as a second optimal reference data block, the second input data block associated with the highest second similarity degree; and
apply, based on a third similarity degree between the first segment and the first optimal reference data block and based on a fourth similarity degree between the second segment and the second optimal reference data block, differential compression to the first input data block, the first optimal reference data block, and the second optimal reference data block in response to determining that the differential compression is to be applied.

* * * * *

UNITED STATES PATENT AND TRADEMARK OFFICE
CERTIFICATE OF CORRECTION

PATENT NO. : 12,026,386 B2  
APPLICATION NO. : 17/951477  
DATED : July 2, 2024  
INVENTOR(S) : Assaf Natanzon Page 1 of 1

It is certified that error appears in the above-identified patent and that said Letters Patent is hereby corrected as shown below:

In the Claims

Claim 11, Column 19, Line 19: "similarity, degree and" should read "similarity degree and"

Claim 17, Column 20, Line 8: "data block the" should read "data block, the"

Claim 17, Column 20, Line 18: "block the" should read "block, the"

Claim 18, Column 20, Line 23: "comprising: applying" should read "comprising applying"

Claim 19, Column 20, Line 27: "comprising: comparing" should read "comprising comparing"

Signed and Sealed this  
Sixth Day of August, 2024

Katherine Kelly Vidal  
*Director of the United States Patent and Trademark Office*